US006552551B2

(12) United States Patent
Komoda et al.

(10) Patent No.: US 6,552,551 B2
(45) Date of Patent: Apr. 22, 2003

(54) METHOD OF PRODUCING LOAD FOR DELAY TIME CALCULATION AND RECORDING MEDIUM

(75) Inventors: Michio Komoda, Tokyo (JP); Sigeru Kuriyama, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/878,352

(22) Filed: Jun. 12, 2001

(65) Prior Publication Data

US 2002/0036508 A1 Mar. 28, 2002

(30) Foreign Application Priority Data

Sep. 27, 2000 (JP) .......................... 2000-294769

(51) Int. Cl.[7] .......................... G01R 27/26; G06G 7/48; G06F 17/50
(52) U.S. Cl. .............................. 324/678; 703/14; 716/6
(58) Field of Search .............................. 324/677, 676, 324/678, 765; 703/14, 15; 716/2, 4, 6

(56) References Cited

U.S. PATENT DOCUMENTS 6,038,383 A * 3/2000 Young et al. .................. 703/14
6,378,109 B1 * 4/2002 Young et al. .................. 716/2

FOREIGN PATENT DOCUMENTS

JP A 3-058279 3/1991

OTHER PUBLICATIONS

"Modeling the Driving–Point Characteristic of Resistive Interconnect for Accurate Delay Estimation", Proc. IEEE International Conference on Computer–Aided Design, 1989, Peter R. O'Brien et al., IEEE.
"Performance Computation for Precharacterized CMOS Gates with RC Loads", IEEE Transactions on Computer–Aided Design of Integrated Circuits and Systems, vol. 15, No. 5, May 1996, Florentin Dartu et al., IEEE.
U.S. patent application Ser. No. 09/879,197, Michio Komoda et al., "Recording Medium Storing Estimation Program", Jun. 13, 2001.

* cited by examiner

Primary Examiner—Christine Oda
Assistant Examiner—James Kerveros
(74) Attorney, Agent, or Firm—Burns, Doane, Swecker & Mathis, LLP

(57) ABSTRACT

In cases where a delay time in a wire, which connects a first NAND placed on the upstream side and a second NAND placed on the downstream side, is calculated, there are a plurality of logical paths in the first NAND, and a parasitic capacitance of an output pin of the first NAND is determined for each logical path. Therefore, the parasitic capacitance corresponding to each logical path of the first NAND is separated from a fixed load model which indicates a sum of a load of the wire and a capacitance of an input pin of the second NAND, and the parasitic capacitance is added to the fixed load model in the calculation of the delay time. Accordingly, a load for the delay time calculation can be produced while precisely reflecting the parasitic capacitance changing with the logical path on the load production, and the delay time calculation can be performed with high accuracy.

4 Claims, 3 Drawing Sheets

METHOD OF PRODUCING LOAD FOR DELAY TIME CALCULATION AND RECORDING MEDIUM

BACKGROUND OF THE INVENTION

1. Field of the Invention

The present invention relates to a method of producing a load for calculating a delay time of a logic circuit, which is composed of P-channel metal oxide semiconductor (PMOS) transistors and N-channel metal oxide semiconductor (NMOS) transistors. The present invention also relates to a recording medium for recording the producing method.

2. Description of Related Art

A group of FIG. 5, FIG. 6 and FIG. 7 shows a processing flow in a conventional method of producing a load for a delay time calculation. FIG. 5 shows the extraction of conventional connection information of circuits in which an NAND 101 and an NAND 102 denoting logic circuits are connected with each other through a wire 103. As shown in FIG. 6, information of the circuit configuration, in which a load is indicated by using resistive-capacitive (RC) elements, is prepared from the connection information. Here, a source model of the NAND 101 having two inputs is indicated by an electric power source 104 and a resistor 105. Also, a load constituent element 108 is formed by determining to a third-order a parasitic capacitance Cd of an output pin Y of the NAND 101, a resistor-capacitor (RC) distribution constant circuit 107 of the wire 103 and a capacitance Cg of an input pin of the NAND 102 so as to match an admittance which is seen from a gate output terminal of the source model 106.

Thereafter, as shown in FIG. 7, in the load constituent element 108, a composite capacitance of both an input side capacitance of the RC distribution constant circuit 107 and the parasitic capacitance Cd of the output pin Y is indicated by a capacitance C2, a composite capacitance of both an output side capacitance of the RC distribution constant circuit 107 and the capacitance Cg of the input pin is indicated by a capacitance C1, and a load model 109 is prepared by using the capacitances C1 and C2 and a resistance R of the RC distribution constant circuit 107. An approximation to the resistor R and capacitors of the capacitances C1 and C2, which compose the load model 109, is performed by using finite RC elements. Here, even though any type of source model 106 is connected with the load model 109 to form a circuit network shown in FIG. 6, a π type model composed of two capacitor elements and one resistor element is formed as the load model 109 so as to approximate a calculated voltage waveform, which is obtained in the gate output terminal of the source model 106 by analyzing the load model 9 shown in FIG. 7, to an actual voltage waveform which is obtained in the gate output terminal of the source model 106 by connecting the load constituent element 108 shown in FIG. 6 with the source model 106.

This approximation method is described in detail, as a prior art, in the literature "Modeling the Driving-Point Characteristic of Resistive Interconnect for Accurate Delay Estimation" (Proc. IEEE International Conference on Computer-Aided Design, 1989). Therefore, a detailed description of the approximation method is omitted. In brief, the calculation of an admittance Y(S) is started from a downstream point according to a source pattern, the admittance Y(S) seen from the output of a source gate is calculated (refer to FIG. 3, an equation (19) and equations following the equation (19) in the literature), and a resistor R and capacitances C1 and C2 are determined (refer to equations (14) to (16) in the literature). Returning to the group of FIG. 5, FIG. 6 and FIG. 7, the source model 106 is connected with the load model 109, a response analysis is performed for the load model 109 shown in FIG. 7, and a delay time in the load model 109 is determined. The source model 106 is formed of the electric power source 104 and the resistor 105, and the source model 106 has a power source value and a resistance value according to a PMOS operation/an NMOS operation (an output is "Rise" or "Fall") and an NMOS transistor actually operated among NMOS transistors arranged in series.

Next, an operation is described. For example, as shown in FIG. 8, the NAND circuit 101 having the two inputs is composed of two PMOS transistors P1 and P2 and two NMOS transistors N1 and N2. Cd1 and Cd2 respectively indicates a parasitic capacitance of the output pin Y of the NAND circuit 101. In this configuration of the source model 106, when an electric potential of an input terminal A of the NAND circuit 101 is changed from a low (L) level to a high (H) level (a case of "Rise" in a direction from the input terminal A to the output terminal Y), the PMOS transistor P1 is set to an "off" condition, the PMOS transistor P2 is set to an "on" condition, the NMOS transistor N1 is set to an "off" condition, and the NMOS transistor N2 is set to an "on" condition.

Also, as shown in FIG. 9, when an electric potential of an input terminal B of the NAND circuit 101 is changed from the L level to the H level (a case of "Rise" in a direction from the input terminal B to the output terminal Y), the PMOS transistor P1 is set to an "on" condition, the PMOS transistor P2 is set to an "off" condition, the NMOS transistor N1 is set to an "on" condition, and the NMOS transistor N2 is set to an "off" condition.

It is also sometimes the case that the electric potential of the input terminal A is changed from the H level to the L level (a case of "Fall" in the direction from the input terminal A to the output terminal Y), and it is sometimes the case that the electric potential of the input terminal B is changed from the H level to the L level (a case of "Fall" in the direction from the input terminal B to the output terminal Y). Therefore, there are four logical paths in the two-input NAND circuit 101 functioning as a logic circuit. In the prior art, a source model 106 corresponding to the condition of each logical path is connected with the load model 109, the response analysis is performed for the load model 109, and a delay time in the load model 109 is determined as a delay time in the load constituent element 8.

Because the conventional method of producing a load for a delay time calculation is performed as is described above, the parasitic capacitance Cd1, the parasitic capacitance Cd2 or a composite parasitic capacitance Cd1+Cd2 is seen from the output pin Y of the NAND circuit 101 according to each of the four logical paths. That is, a parasitic capacitance denoting a part of the load is determined in dependence on the electric potential of each input terminal A or B. Therefore, because only one value is allocated to the parasitic capacitance of the fixed load model 109 in the conventional method in which the source model 106 is connected with the fixed load model 109 for each logical path, errors in the delay analysis are increased because of the change of the parasitic capacitance with the logical path. In particular, in cases where an area of the wire 103 and a load based on a gate capacitance are small, errors in the delay analysis are further increased. Therefore, there is a problem that a delay time in the load constituent element 108 cannot be calculated with high accuracy.

SUMMARY OF THE INVENTION

An object of the present invention is to provide, with due consideration to the drawbacks of the conventional method of producing a load for a delay time calculation, a method of producing a load for a delay time calculation in which a parasitic capacitance changing for each logical path is precisely indicated while using the conventional analyzing method.

The object is achieved by the provision of a method of producing a load for calculating a delay time of a logic circuit having a PMOS transistor and an NMOS transistor, comprising the steps of separating a parasitic capacitance of an output pin of the logic circuit from a load model denoting a load constituent element, and adding the parasitic capacitance corresponding to each of a plurality of logical paths of the logic circuit to the load model in a delay time calculation for the load model.

Because the logic circuit has a PMOS transistor and an NMOS transistor, there are a plurality of logical paths of the logic circuit, and the parasitic capacitance changes with the logical path of the logic circuit. In the present invention, because the parasitic capacitance is separated from the load model, the parasitic capacitance corresponding to each logical path of the logic circuit can be easily set and added to the load model in the delay time calculation for the load model.

Accordingly, a load for the delay time calculation can be produced while precisely reflecting the parasitic capacitance changing with the logical path on the load production, and the delay time calculation can be performed with high accuracy. Also, because the parasitic capacitance is indicated by only a capacitor, a composite load of both the parasitic capacitance and a load of the load model is equivalent to a π type load which is obtained by combining the parasitic capacitance and the load model, and a delay time in the composite load can be calculated in the same manner as the method in the prior art.

It is preferred that the parasitic capacitance of the output pin is indicated by a single capacitive element.

Therefore, the calculation of the delay time can be performed in the same manner as the method in the prior art.

It is preferred that the parasitic capacitance of the output pin is indicated by a plurality of capacitive-resistive elements.

Therefore, the parasitic capacitance can be modeled in more detail, and the calculation of the delay time can be performed with high precision.

This method may be performed by a computer. A recording medium is provided that stores a computer program allowing the computer to perform the method. Therefore, the method of producing a load for calculating a delay time can be easily used.

DETAILED DESCRIPTION OF THE PREFERRED EMBODIMENTS

Embodiments of the present invention will now be described with reference to the accompanying drawings.

Embodiment 1

Figure 1:
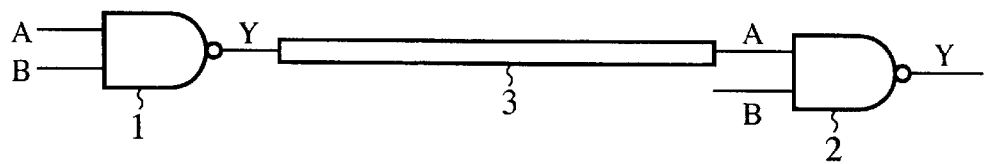
FIG. 1 shows the extraction of circuit connection information according to a first embodiment of the present invention.
Figure 2:
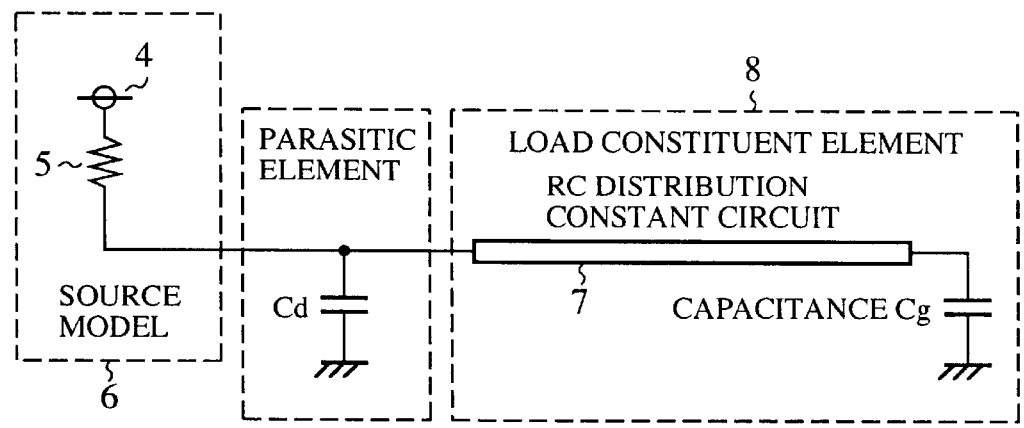
FIG. 2 shows the preparation of circuit configuration information according to the first embodiment of the present invention.
Figure 3:
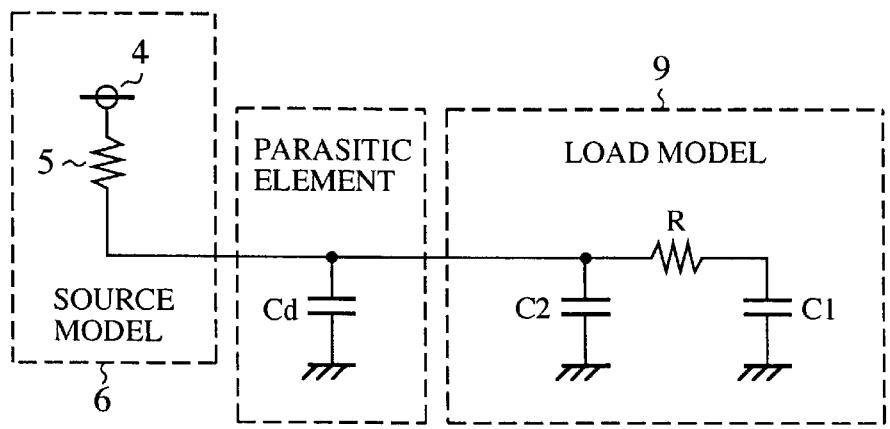
FIG. 3 shows the preparation of a load model according to the first embodiment of the present invention.

A group of FIG. 1, FIG. 2 and FIG. 3 shows a processing flow in a method of producing a load for a delay time calculation. FIG. 1 shows the extraction of connection information of circuits in which an NAND 1 (or a logic circuit) placed on the upstream side and an NAND 2 placed on the downstream side are connected with each other through a wire 3. The NAND1 and the NAND 2 denote logic circuits. As shown in FIG. 2, a source model 6 denoting the NAND 1 is indicated by an electric power source 4 and a resistor 5, and a parasitic capacitance Cd of an output pin Y of the NAND 1 is indicated independently. Also, a load constituent element 8 is indicated by both a resistor-capacitor (RC) distribution constant circuit 7 denoting the wire 3 and a capacitor having a capacitance Cg of an input pin of the NAND 2. Therefore, information of the circuit configuration is prepared as a whole from the connection information. Here, a capacitor having the parasitic capacitance Cd of the output pin Y of the NAND 1 is not included in the load constituent element 8.

Thereafter, as shown in FIG. 3, an input side capacitance of the RC distribution constant circuit 7 is expressed by a capacitance C2, a composite capacitance of both an output side capacitance of the RC distribution constant circuit 7. The capacitance Cg of the input pin is expressed by a capacitance C1, and a load model 9 is prepared by using the composite capacitance C1, the capacitance C2 and a resistance R of the RC distribution constant circuit 7. In this case, the parasitic capacitance Cd of the output pin of the NAND 1 is separated from the load model 9. In the preparation of the load model 9, an approximation of the load model 9 to the load constituent element 8, in which the parasitic capacitance Cd is not included, is performed in the same manner as in the prior art. Thereafter, in a delay time calculation, a delay time in both a capacitor of the parasitic capacitance Cd and the load model 9 is calculated as a delay time in the wire 3 according to the parasitic capacitance Cd corresponding to each of the four logical paths and the source model 6.

As is described above, in the first embodiment, a load to be used for a delay time calculation can be produced while precisely reflecting the parasitic capacitance, which changes with the logical path, on the load production, and the delay time calculation can be performed with high accuracy. Also, because the parasitic capacitance Cd is indicated by only a capacitor, a composite load of both the parasitic capacitance Cd and a load of the load model 9 is equivalent to a (C2+Cd/R/C1)π type load which is obtained by combining the parasitic capacitance Cd and the load model 9, and the delay time in the composite load can be calculated in the same manner as the method in the prior art.

Figure 7:
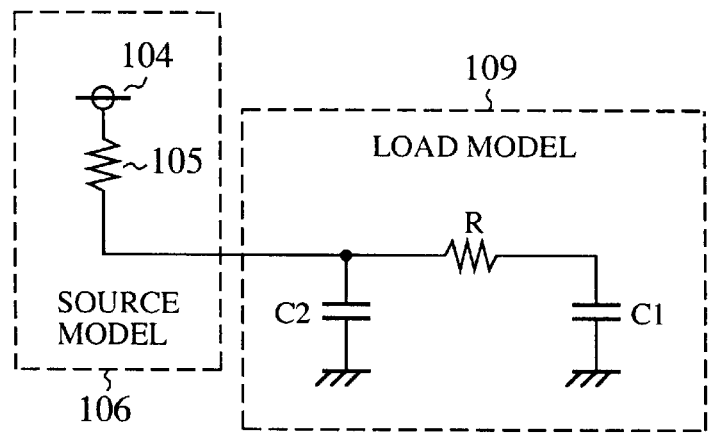
FIG. 7 shows the preparation of a conventional load model.
Figure 8:
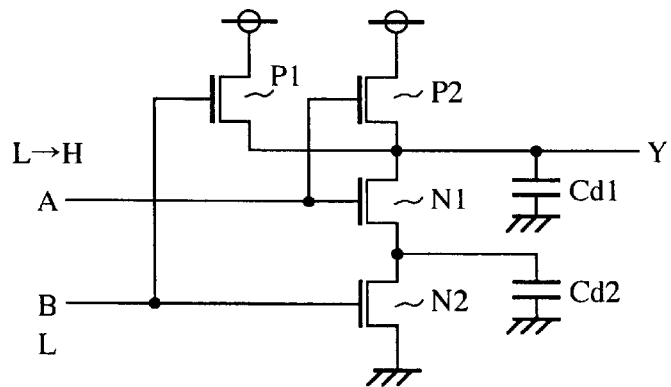
FIG. 8 shows both a transistor circuit of a two-input NAND circuit and a group of parasitic capacitances and is an explanatory diagram of a logical path set in a case where an electric potential of an input terminal A is changed from an L level to an H level.
Figure 9:
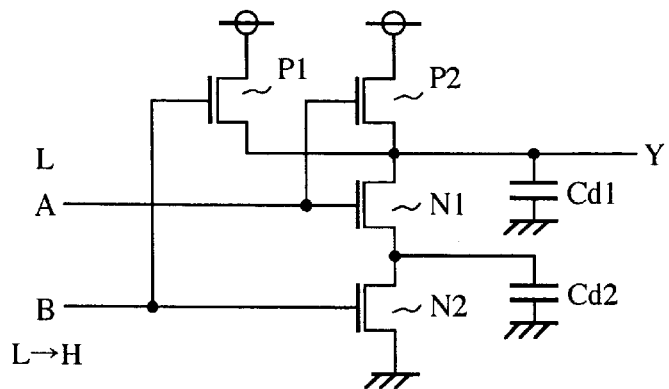
FIG. 9 shows both the transistor circuit of the two-input NAND circuit and the group of parasitic capacitances and is an explanatory diagram of another logical path set in a case where an electric potential of an input terminal B is changed from an L level to an H level.

With respect to the method in other prior art, in an article "Performance Computation for Precharacterized CMOS Gates with RC Loads", the configuration (which is the same as a circuit configuration desired to be analyzed in the present invention) placed on the left side of FIG. 7 is replaced with a capacitance response which is placed on the right side of FIG. 7 and is equivalent to the configuration of the left side, and a delay time calculation is disclosed. The equations (12) to (14) in the above article are used to obtain an effective capacitance Ceff. Though a correspondence table of the effective capacitance Ceff and a delay time is not disclosed in the above article, the correspondence table is generally prepared in advance, and the delay time can be obtained.

Embodiment 2

Figure 4:
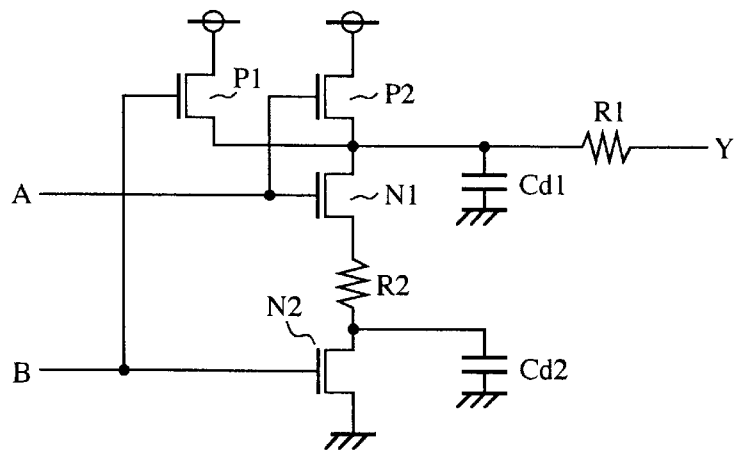
FIG. 4 is a configuration diagram of a two-input NAND circuit, in which a parasitic circuit composed of a plurality of RC elements is arranged, according to a second embodiment of the present invention.
Figure 5:
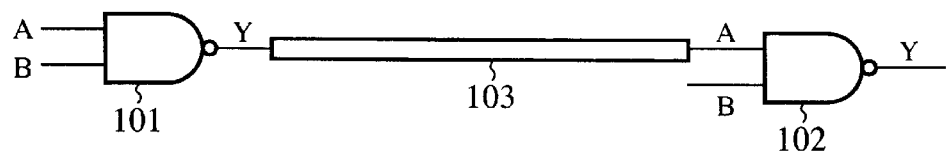
FIG. 5 shows the extraction of conventional circuit connection information.
Figure 6:
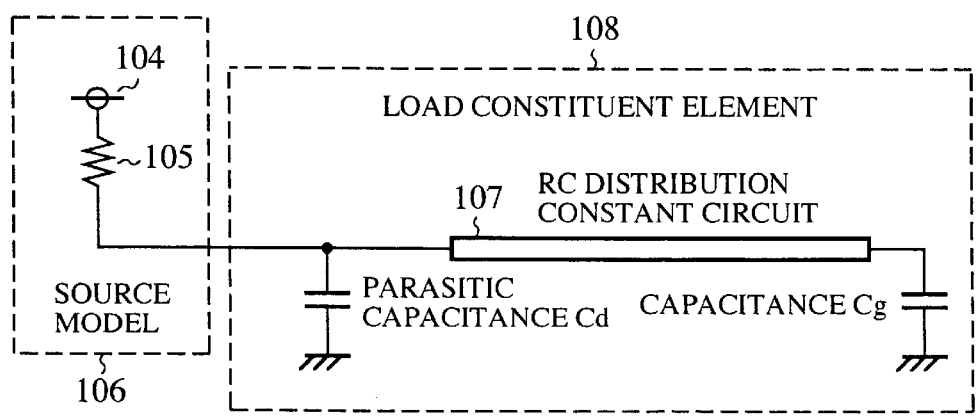
FIG. 6 shows the preparation of conventional circuit configuration information.

In the first embodiment, one parasitic capacitance is considered in the production of the load. However, it is preferred that a plurality of resistive-capacitive (RC) parasitic elements indicate the parasitic capacitance Cd of the output pin Y of the NAND 1. For example, as shown in FIG. 4, the parasitic capacitance Cd is determined from resistive components R1 and R2 of wires connecting transistors and the parasitic capacitances Cd1 and Cd2. In this case, the load model 9 already prepared is put on the downstream side, a parasitic element circuit of the parasitic capacitance Cd is put on the upstream side, and the method disclosed in the literature "Modeling the Driving-Point Characteristic of Resistive Interconnect for Accurate Delay Estimation" is used. That is, (1) An admittance Y(S) corresponding to the load model 9, which is composed of the resistor R and the capacitances C1 and C2, is inversely calculated according to the equations (14) to (16) of the literature.

(2) After the inverse calculation of the admittance Y(S), because an assumed parasitic element circuit having the parasitic capacitance Cd exists on the upstream side, an admittance Y(S) seen from the output terminal of the source model 6 is calculated in the same manner as the inverse calculation in the item (1).

(3) A π type model (which differs from the load model 9 of the item (1)) corresponding to the admittance Y(S) calculated in the item (2) is determined according to the equations (14) to (16) of the literature.

Therefore, the π type model connected with the source model 6 is prepared in the delay time calculation.

As is described above, in the second embodiment, because the parasitic capacitance Cd can be modeled in more detail separately from the load model 9, the delay time can be calculated with higher precision.

Embodiment 3

In this embodiment, a computer program allowing a computer to perform the delay time calculating method prepared according to the method of producing a load for a delay time calculation in the first or second embodiment is recorded in a recording medium. Therefore, when the computer program is read out from the recording medium and is executed by the computer, the delay time calculating method can be immediately performed.

What is claimed is:

1. A method of producing a load for calculating a delay time of a logic circuit having a PMOS transistor and an NMOS transistor, comprising the steps of:

separating a parasitic capacitance of an output pin of the logic circuit from a load model denoting a load constituent element; and adding the parasitic capacitance corresponding to each of a plurality of logical paths of the logic circuit to the load model in a delay time calculation for the load model.

2. A method of producing a load for a delay time calculation according to claim 1, wherein the parasitic capacitance is indicated by a single capacitive element.

3. A method of producing a load for a delay time calculation according to claim 1, wherein the parasitic capacitance is indicated by a plurality of capacitive-resistive elements.

4. A recording medium, comprising:

a recording area for recording a computer program which allows a computer to perform the method of producing a load for a delay time calculation determined according to the claim 1.

* * * * *